(12) United States Patent
Goerlach et al.

(10) Patent No.: US 7,964,930 B2
(45) Date of Patent: Jun. 21, 2011

(54) SEMICONDUCTOR DEVICE AND METHOD FOR MANUFACTURING SAME

(75) Inventors: Alfred Goerlach, Kusterdingen (DE); Ning Qu, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 7 days.

(21) Appl. No.: 11/667,440

(22) PCT Filed: Sep. 13, 2005

(86) PCT No.: PCT/EP2005/054538
§ 371 (c)(1),
(2), (4) Date: Sep. 26, 2007

(87) PCT Pub. No.: WO2006/048354
PCT Pub. Date: May 11, 2006

(65) Prior Publication Data
US 2008/0128850 A1    Jun. 5, 2008

(30) Foreign Application Priority Data
Nov. 8, 2004  (DE) .......................... 10 2004 053 760

(51) Int. Cl.
*H01L 27/095* (2006.01)
(52) U.S. Cl. ........ 257/471; 257/475; 257/476; 257/478; 257/E21.359; 257/E29.338

(58) Field of Classification Search .................. 257/471, 257/475, 476, 478, E21.359, E29.338
See application file for complete search history.

(56) References Cited

U.S. PATENT DOCUMENTS

| | | | |
|---|---|---|---|
| 4,982,260 A | 1/1991 | Chang et al. | |
| 5,365,102 A | 11/1994 | Mehrotra et al. | |
| 5,612,567 A * | 3/1997 | Baliga ........................... | 257/475 |
| 6,078,090 A | 6/2000 | Williams et al. | |
| 6,252,288 B1 * | 6/2001 | Chang ........................... | 257/471 |
| 6,404,032 B1 * | 6/2002 | Kitada et al. ................... | 257/471 |
| 6,404,033 B1 * | 6/2002 | Chang et al. ................... | 257/484 |
| 6,501,146 B1 | 12/2002 | Harada | |
| 6,998,694 B2 * | 2/2006 | Wu .............................. | 257/471 |
| 2001/0000033 A1 * | 3/2001 | Baliga ........................... | 438/270 |
| 2002/0125541 A1 * | 9/2002 | Korec et al. .................... | 257/471 |
| 2003/0042538 A1 | 3/2003 | Kumar et al. | |

FOREIGN PATENT DOCUMENTS

| | | |
|---|---|---|
| JP | 11-8399 | 1/1999 |
| JP | 2001-284604 | 10/2001 |
| JP | 2002-9082 | 1/2002 |

OTHER PUBLICATIONS

International Search Report, PCT International Patent Application No. PCT/EP2005/054538, dated Feb. 6, 2006.

* cited by examiner

*Primary Examiner* — Andy Huynh
(74) *Attorney, Agent, or Firm* — Kenyon & Kenyon LLP

(57) ABSTRACT

A semiconductor device includes a trench MOS barrier Schottky diode having an integrated PN diode and a method is for manufacturing same.

27 Claims, 3 Drawing Sheets

SEMICONDUCTOR DEVICE AND METHOD FOR MANUFACTURING SAME

FIELD OF THE INVENTION

The present invention relates to a semiconductor device and a method for manufacturing same.

BACKGROUND INFORMATION

In modern motor vehicles, more and more functions are being implemented using electrical components. This results in an ever-increasing demand for electric power. To meet this demand, the efficiency of the generator system in the motor vehicle must be increased. So far, PN diodes have been usually used as Zener diodes in the generator system of the motor vehicle. Advantages of PN diodes include low reverse current and great sturdiness. However, the main disadvantage is a comparatively high forward voltage UF. At room temperature, current begins to flow only at a forward voltage UF of approximately 0.7 V. Under normal operating conditions at which the current density is approximately 500 A/cm$^2$, forward voltage UF increases to more than 1 V. This results in a decline in efficiency.

On the basis of theoretical considerations, the Schottky diode might be considered as an alternative. A Schottky diode has a much lower forward voltage than a PN diode. For example, the forward voltage of a Schottky diode is approximately 0.5 V to 0.6 V at a current density of approximately 500 A/cm$^2$. Furthermore, a Schottky diode as a majority carrier component offers advantages in rapid switching operation. Schottky diodes have not yet been used in the generator system of a motor vehicle. This may be attributed to some significant disadvantages of a Schottky diode which make such an application appear to be less relevant. First, a Schottky diode has a higher reverse current than a PN diode. This reverse current also has a strong dependence on the reverse voltage. Finally, a Schottky diode has inferior sturdiness, in particular at high temperatures. These disadvantages have so far prevented the use of Schottky diodes in automotive applications.

Measures for improving the properties of Schottky diodes are described in T. Sakai et al., "Experimental investigation of dependence of electrical characteristics on device parameters in Trench MOS Barrier Schottky Diodes," Proceedings of 1998 International Symposium on Power Semiconductors & ICs, Kyoto, pp. 293-296, and from German Published Patent Application No. 694 28 996 T2, resulting in the so-called TMBS (TMBS=trench-MOS-barrier Schottky diode). One advantage of such a TMBS is the possible reduction in reverse current. Reverse current flows mainly along the surface of a trench formed in the diode structure through a quasi-inversion-layer of the MOS structure of the diode. Consequently, the MOS structure may be degraded from an n-epi layer to an oxide layer by injection of "hot" charge carriers and may even be destroyed under particularly adverse conditions. Since a certain amount of time is needed for formation of the inversion channel, the space charge zone may briefly propagate further at the beginning of rapid switching operations and consequently the electrical field strength may increase. This may result in brief unwanted breakdown operation of the diode. It is therefore not very advisable to use a TMBS that has been improved with regard to the reverse current as a Zener diode and operate it in the breakdown range.

SUMMARY

Example embodiments of the present invention provide that injection of so-called "hot" charge carriers is prevented. This is achieved in that the high field strength occurring in a breakdown is not near the sensitive oxide layer because the breakdown voltage of the integrated PN diode is lower than the breakdown voltages of the Schottky diode and the MOS structure. The semiconductor device is therefore characterized by a particularly great sturdiness, which permits reliable use of the semiconductor device in the electrical system of a motor vehicle, in particular in the generator system of the electrical system. The semiconductor device may be reliable when operated at breakdown voltages on the order of a few 10 V and at current densities of few hundred A/cm$^2$. An example embodiment of the semiconductor device may include an n+ substrate on which there is an n-layer in which trenches have been created. The trenches are filled with a p region over at most a portion of their depth. The n+ substrate and the n-layer each carry a contact layer, the contact layer being separated from the n-layer by an oxide layer in the area of the walls of the trenches.

An example embodiment of the semiconductor device includes an n+ substrate on which there is an n-layer in which trenches have been created. The walls of the trenches are completely covered with an oxide layer, but the bottoms of the trenches are at most partially covered with an oxide layer. Beneath the trenches there are p regions in the n-layer created by diffusion. The n+ substrate and the n-layer carry contact layers.

Additional aspects and features of example embodiments of the present invention as well as methods for manufacturing the semiconductor devices are are described in more detail below with reference to the appended Figures.

DETAILED DESCRIPTION

Figure 1:
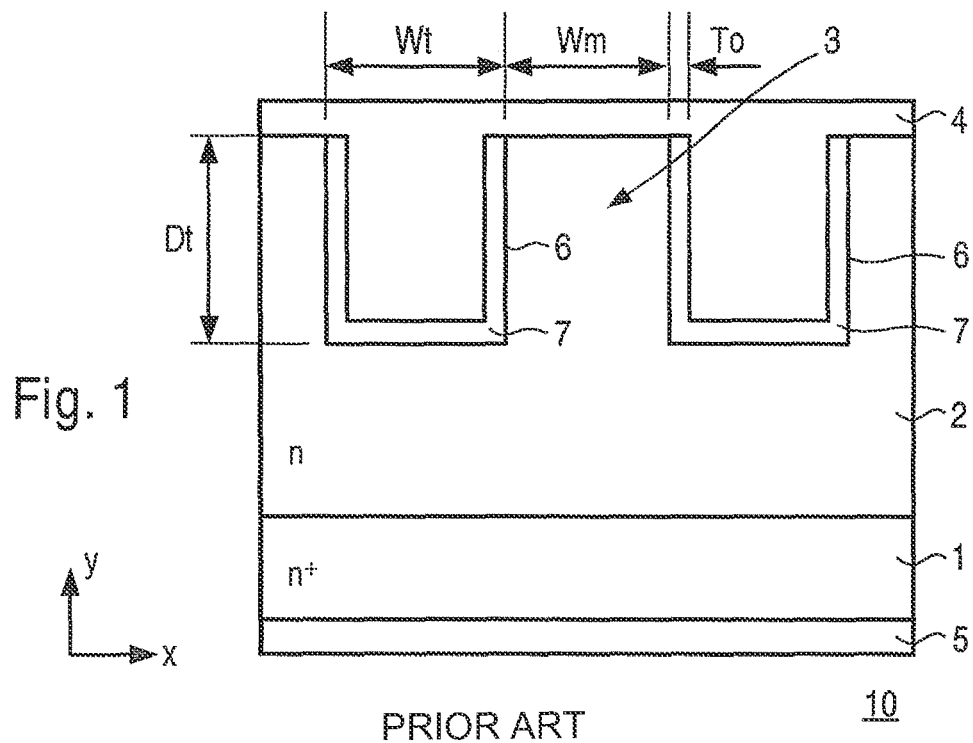
FIG. 1 shows a conventional TMBS diode.

FIG. 1 shows a conventional semiconductor device 10, namely a so-called TMBS diode, referred to below simply as a TMBS. First, the design of such a TMBS is described to also show more clearly the advantages achieved with example embodiments of the present invention in comparison with this. TMBS 10 has an n+ substrate 1 and an n-layer 2 on this n+ substrate. Trenches 6 are created in this n-layer 2. The bottom areas and walls of trenches 6 are covered with an oxide layer 7. A metal layer 4 on the front side of TMBS 10 functions as the anode. A metal layer 5 on the back of TMBS 10 functions as the cathode. Electrically, TMBS 10 is a combination of an MOS structure (metal layer 4, oxide layer 7 and n-layer 2) and a Schottky diode. The Schottky barrier here is between metal layer 4 as the anode and n-layer 2 as the cathode.

A current flows in the forward direction through mesa region 3 of TMBS 10 enclosed by trenches 6. Trenches 6 themselves are not available for current flow. The effective area for current flow in the forward direction is therefore smaller with a TMBS than with a conventional planar Schottky diode. The advantage of such a TMBS 10 is the reduction in the reverse current. In the reverse direction, space charge zones develop with both the MOS structure and the Schottky diode. The space charge zones expand with an increase in voltage, and come into contact with each other in the middle of mesa region 3 between neighboring trenches 6 at a voltage lower than the breakdown voltage of TMBS 10. Therefore, the Schottky effect responsible for the high reverse current is screened and the reverse current is reduced. This screening effect depends greatly on the structural parameters of the TMBS, such as in particular Dt (depth of trench 6), Wm (distance between trenches 6), Wt (width of trench 6) and To (thickness of oxide layer 7). The screening action for the Schottky effect is therefore much more effective in the TMBS in comparison with a JBS (junction-barrier Schottky diode) having diffused p troughs. However, a significant disadvantage of the conventional TMBS is the weakness of the MOS structure. In a breakdown, very large electrical fields occur within oxide layer 7 and in n-layer 2 in the immediate vicinity of oxide layer 7. Reverse current flows mainly through the quasi-inversion-layer of the MOS structure along the surface of trenches 6. As a result, the MOS structure may be degraded by injection of "hot" charge carriers from n-layer 2 into oxide layer 7 and may even be destroyed under certain adverse operating conditions. Since a certain amount of time is needed to form the inversion channel (deep depletion), the space charge zone may spread out further briefly at the beginning of fast switching operations and therefore the electrical field strength may increase further. This may result in a brief unwanted breakdown operation. It is therefore not advisable to use a TMBS as a Zener diode or to operate it in the breakdown range.

Example embodiments of the present invention avoid this problem by integrating a PN diode that functions as a clamp element into the TMBS. Semiconductor device 20 designed according to example embodiments of the present invention is described below and may also be referred to as TMBS-PN. The design of the p regions in this semiconductor device 20 ensures that breakdown voltage BV_pn of the PN diode is lower than breakdown voltage BV_schottky of the Schottky diode and breakdown voltage BV_mos of the MOS structure. In addition, this ensures that the great field strength occurring in a breakdown is not near an oxide layer and therefore no injection of hot charge carriers need be feared. Furthermore, the barrier current flows mainly through the PN diode instead of the inversion-layer of the MOS structure. These properties impart a great sturdiness to semiconductor device 20. It is therefore especially suitable as a Zener diode for use in a motor vehicle electric system, in particular in conjunction with the generator system of a motor vehicle.

Figure 2:
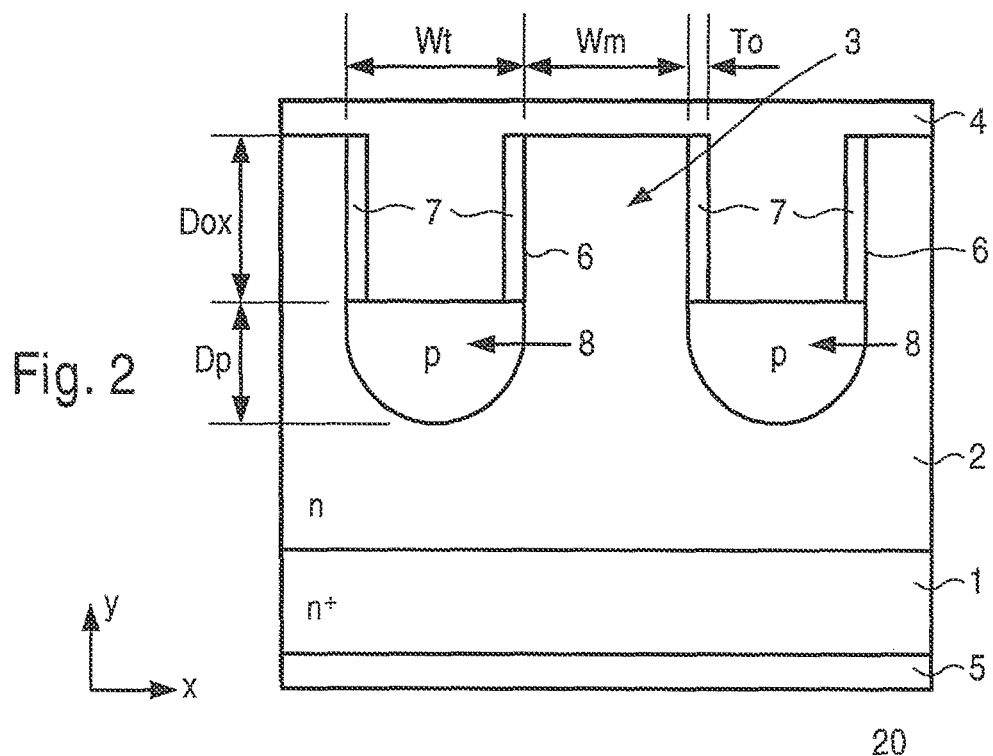
FIG. 2 shows an exemplary embodiment of a semiconductor device designed according to the present invention.

An exemplary embodiment of a semiconductor device designed according to the present invention is described below with reference to FIG. 2.

Semiconductor device 20 includes p-doped regions 8 made of Si or poly-Si in the lower range of trenches 6. These regions 8 may be designed to be trough-shaped. Specifically, semiconductor device 20 has an n+ substrate 1, an n-layer 2 on this substrate 1 and trenches 6 introduced into n-layer 2. At least two trenches 6 may be provided. Trenches 6 may be designed as strips e.g., extending parallel to one another in n-layer 2. In other example embodiments of the present invention, trenches 6 may also be arranged like islands in n-layer 2. The cross sections of these trenches 6 arranged in islands may then be of any shape. In the sense of good reproducibility and easy manufacturing, however, the islands may have a regular cross section, i.e., circular, hexagonal, etc., for example. Trenches 6 may be created by an etching operation that removes the material of n-layer 2 in the etching area. The base areas and walls of trenches 6 are covered with an oxide layer 7. Contact layers 4, 5 are provided on the front side of semiconductor device 20 as anode 4 and on the back side as cathode 5. An oxide layer 7 is situated between the side walls of trenches 6 and metal layer 4. Lower region 8 of trenches 6 is filled with p-doped Si or poly-Si. Here, p regions 8 are designed so that no charge compensation occurs between n-layer 2 and p regions 8. In example embodiments of the present invention, contact layer 4 in particular may also have two metal layers situated one above the other. For simplicity, this is not shown in FIG. 2. The part of the depth of trenches 6 covered by an oxide layer 7 is labeled as Dox. The portion of the depth of trenches 6 filled with a p region is labeled as Dp. The distance between trenches 6 is Wm. The width of trenches 6 and/or the p regions arranged in trenches 6 is labeled as Wt. The thickness of oxide layer 7 is designated as To.

Figure 4:
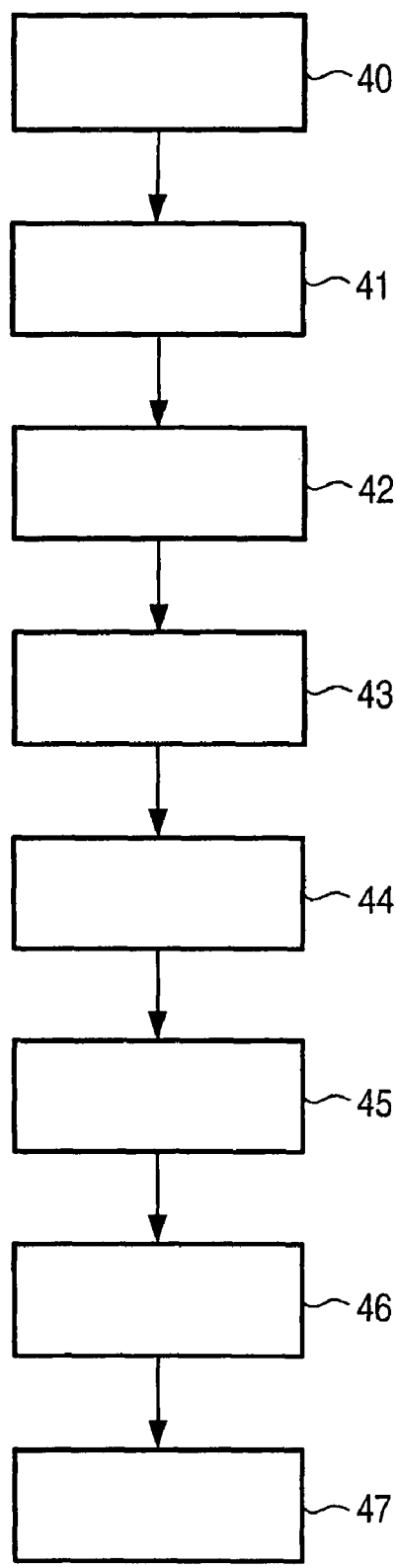
FIG. 4 shows a flow chart of a manufacturing method.

Semiconductor device 20 may be manufactured by the following method. In this context, reference is also made to the flow chart in FIG. 4. It starts with an n+ substrate 1 (step 40). An n-layer 2 is applied to this n+ substrate 1 (step 41). This may be done using an epitaxial method. In a next step 42, trenches 6 are etched into n-layer 2. Next trenches 6 are filled with p-doped Si or poly-Si (step 43). In a subsequent etching process, p-doped Si or poly-Si is etched away in trenches 6 so that only a portion Dp of the depth of trenches 6 is filled with p-doped Si or poly-Si (step 44). In a next step 45, the bottoms and walls of trenches 6 are covered with an oxide layer. In a next etching step (step 46) the oxide layer is removed from the bottoms of trenches 6 so that only the walls of trenches 6 are covered with an oxide layer 7. In another step 47, contact layers 4 and 5, e.g., made of metal, are applied to the front and back sides of semiconductor device 20.

The functioning of semiconductor device 20 is explained below. Electrically, semiconductor device 20 is a combination of an MOS structure (contact layer 4, oxide layer 7 and n-layer 2), a Schottky diode (Schottky barrier between contact layer 4 as the anode and n-layer 2 as the cathode) and a PN diode (PN junction between p regions 8 as the anode and n-layer 2 as the cathode). As in a conventional TMBS 10, the current in semiconductor device 20 flows in the forward direction but only through the Schottky diode. In the reverse direction, space charge zones develop in both the MOS structure and in the Schottky diode and the PN diode. The space charge zones expand with an increase in voltage and collide in the middle of mesa region 3 between neighboring trenches 6 at a voltage lower than the breakdown voltage of semiconductor device 20. The Schottky effect responsible for a high reverse current is therefore shielded and the reverse current is thus reduced. This shielding effect depends greatly on structure parameters such as Dox (portion of the depth of trench 6 having an oxide layer), Wm (distance between trenches), Wt (width of trench 6 and/or p regions 8), Dp (portion of depth of trench 6 having p-doped Si or poly-Si) and To (thickness of oxide layer) and therefore may be advantageously influenced by suitable dimensioning of the aforementioned structural parameters. Semiconductor device 20 has a shielding action for the Schottky effect similar to that of conventional TMBS 10 but it offers in addition a great sturdiness due to the clamp function. Breakdown voltage BV_pn of the PN diode may be designed so that it is lower than breakdown voltage BV_schottky of the Schottky diode and breakdown voltage BV_mos of the MOS structure. In addition, this ensures that the breakdown will occur at the bottom of trenches 6. In breakdown operation, the reverse current then flows only through PN junctions and not through the inversion-layer of the MOS structure, as in the case of a conventional TMBS 10. Semiconductor device 20 thus has a sturdiness similar to that of a PN diode. In addition, there need be no fear of injection of "hot" charge carriers in the case of semiconductor device 20 because in the case of breakdown the high field strength does not occur near the MOS structure. Consequently, semiconductor device 20 is especially suitable as a Zener diode for use in a motor vehicle electric system, in particular in the generator system of a motor vehicle.

Figure 3:
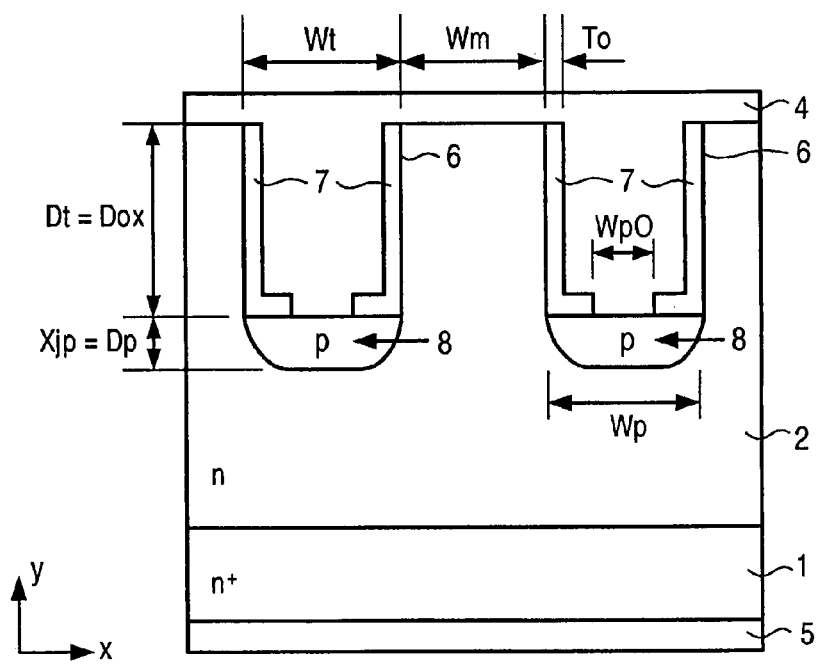
FIG. 3 shows an example embodiment of a semiconductor device.

Another example embodiment of the present invention is explained with reference to FIG. 3. In the case of this semiconductor device 30, p regions 8 are manufactured by diffusion beneath trenches 6. Semiconductor device 30 also includes an n+ substrate 1. An n-layer 2 is provided on this substrate 1. At least two trenches 6 are introduced into n-layer 2. Semiconductor device 30 has contact layers 4 and/or 5 on the front and back sides. The walls of trenches 6 and a portion of their bottoms are covered with an oxide layer 7. Below trenches 6, p regions 8 are formed by diffusion of a p dopant, e.g., boron. With n-layer 2, these form a PN diode. In addition to the structural parameters already identified in FIG. 2, the following new structural parameters are included in FIG. 3. The width of p regions 8 on the mask is labeled as Wp0. The depth of penetration of diffusion into n-layer 2 is labeled as Xjp. When dimensioning p regions 8, the breakdown must occur at PN junction 8/2 during breakdown operation, and the breakdown voltage of semiconductor device 30 is determined by the PN diode. This example embodiment also has similarly advantageous properties, in particular a sturdiness comparable to that of the example embodiment described with reference to FIG. 2. An advantage of this second example embodiment in comparison with the first example embodiment (FIG. 2) in particular is that it eliminates the filling of trenches 6 with p-doped Si and/or poly-Si and the subsequent etching of p-doped Si or poly-Si. The boron covering combined with p diffusion belongs to the simpler process steps.

Figure 5:
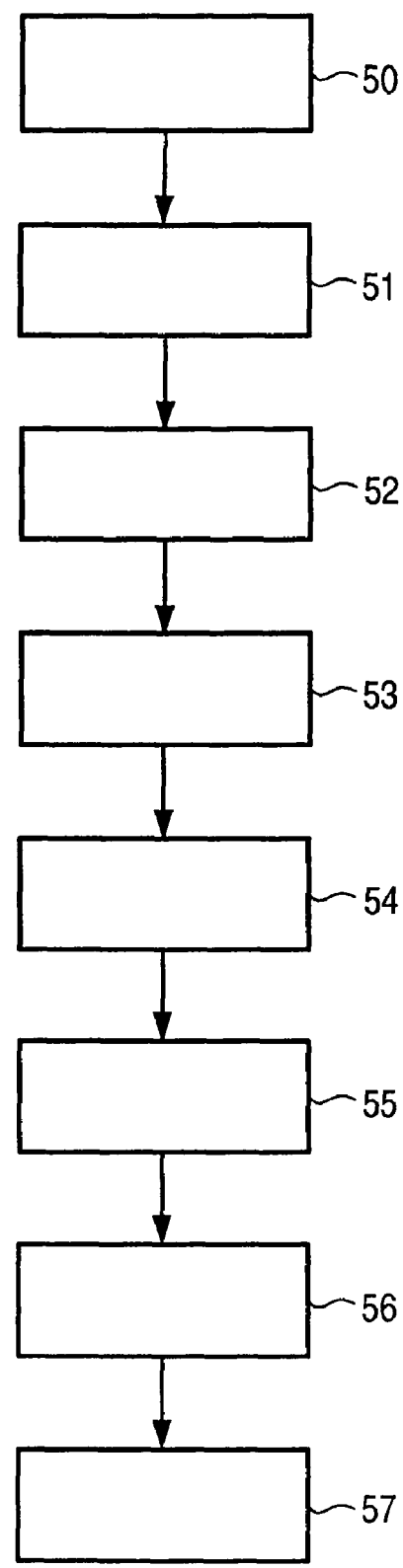
FIG. 5 shows a flow chart of a manufacturing method.

A method for manufacturing semiconductor device 30 is described below (example embodiment according to FIG. 3), reference also being made to the flow chart in FIG. 5. This also starts with an n+ substrate 1 (step 50) to which an n-layer 2 is applied, e.g., by epitaxy (step 51). Trenches 6 are created in n-layer 2 by an etching process (step 52). Next the bottoms and side walls of trenches 6 are covered with an oxide layer (step 53). In a subsequent etching step (step 54), the oxide layer covering the bottoms of trenches 6 is partially removed. This creates a mask of width Wp0 for the subsequent diffusion process. For this, the region of trenches 6 from which the oxide layer has been removed is first covered with a p dopant, e.g., boron (step 55). This may be done by deposition from the gas phase or by ion implantation. Next the diffusion process is performed (step 56) in which boron diffuses into n-layer 2 and forms p regions 8. Finally, contact layers 4 and 5 are again applied to the front and back sides of semiconductor device 30 (step 57) after a photo and etching process have first been performed for opening contact region Wp0.

In additional example embodiments of the present invention, example embodiment 1 as well as example embodiment 2 may also have additional structure in the edge area to reduce the edge field strength. These may be, for example, low-doped p regions, field plates or similar structures.

As already mentioned, semiconductor devices 20, 30 are particularly suitable as Zener diodes in combination with an electrical system of a motor vehicle due to their sturdiness, in particular for use in the generator system of a motor vehicle. Therefore, the semiconductor devices 20, 30 expediently have a breakdown voltage between 12 V and 30 V, in particular between 15 V and 25 V. These semiconductor devices 20, 30 are particularly advantageously operable in blocking operation with a high current density on the order of a few hundred A/cm$^2$, e.g., 400 A/cm$^2$ up to approximately 600 A/cm$^2$.

LIST OF REFERENCE CHARACTERS

| | |
|---|---|
| 1 | n+ substrate |
| 2 | n-doped layer |
| 3 | mesa region |
| 4 | contact layer |
| 5 | contact layer |
| 6 | trench |
| 7 | oxide layer |
| 40 | step |
| 41 | step |
| 42 | step |
| 43 | step |
| 44 | step |
| 45 | step |
| 46 | step |
| 47 | step |
| 50 | step |
| 51 | step |
| 52 | step |
| 53 | step |
| 54 | step |
| 55 | step |
| 56 | step |
| 57 | step |
| BV_mos | breakdown voltage of the MOS structure |
| BV_pn | breakdown voltage of the PN diode |
| BV_schottky | breakdown voltage of the Schottky diode |
| Dox | portion of the depth of trenches having oxide layer |
| Dp | portion of the depth of trenches having Si or poly-Si |
| Dt | depth of trenches |
| To | thickness of oxide layer |
| Wm | distance between trenches |
| Wt | width of trenches |
| Wp0 | width of p regions on mask |

What is claimed is:

1. A semiconductor device, comprising:
    a PN diode;
    a trench MOS barrier Schottky diode having a p region and an n region, together which form the PN diode;
    an n+ substrate;
    an n-layer disposed on the n+ substrate, the n+ substrate and the n-layer including contact layers, the contact layers separated from the n-layer in an area of walls of the trenches by an oxide layer; and
    trenches arranged in the n-layer, the trenches filled with a p region up to at most a portion of their depth, wherein the p regions are disposed in the bottom of the trenches in contact with the n-layer;
    wherein the PN diode is configured as a clamping element, and wherein a breakdown voltage of the PN diode is lower than breakdown voltages of the Schottky diode and a MOS structure.

2. The semiconductor device according to claim 1, wherein the PN diode is configured to perform a blocking operation at a high current density on the order of a few hundred A/cm$^2$.

3. The semiconductor device according to claim 1, wherein the p region is made of p-doped Si or poly-Si.

4. The semiconductor device according to claim 1, wherein the contact layers are made of metal.

5. The semiconductor device according to claim 1, wherein the contact layers are arranged in multiple layers.

6. The semiconductor device according to claim 1, wherein the contact layer forms an ohmic contact with the p region, a Schottky contact with the n-layer and functions as a gate electrode for a MOS structure.

7. The semiconductor device according to claim 1, wherein the trenches have one of a U-shaped cross-section and a rectangular cross-section.

8. The semiconductor device according to claim 1, wherein the trenches are filled with p-doped Si or poly-Si over at most a portion of their depth.

9. The semiconductor device according to claim 1, wherein the device is configured so that in the event of a breakdown of the PN diode, the breakdown occurs in a region of the bottom of the trenches.

10. The semiconductor device according to claim 1, wherein the walls of the trenches are covered completely but the bottoms of the trenches are at most partially covered with an oxide layer, and p regions are disposed beneath the trenches in the n-layer.

11. The semiconductor device according to claim 10, wherein the p regions disposed beneath the trenches are created by covering the bottom of the trenches with a dopant substance and performing a subsequent diffusion process, the oxide layer which only partially covers the bottom of the trenches configured to function as a mask.

12. The semiconductor device according to claim 10, wherein the p regions disposed beneath the trenches are configured such that in breakdown operation a breakdown voltage of the semiconductor device is determined by a breakdown voltage of the PN diode formed by the p regions and the n-layer.

13. The semiconductor device according to claim 10, wherein in breakdown operation breakdown occurs in an area of the p regions disposed beneath the trenches.

14. The semiconductor device according to claim 10, wherein the contact layer carried by the n-layer completely fills up the trenches.

15. The semiconductor device according to claim 10, wherein the trenches are arranged as one of strips and islands.

16. The semiconductor device according to claim 1, wherein the semiconductor device is configured as a Zener diode.

17. The semiconductor device according to claim 1, wherein the semiconductor device is configured as a component of at least one of (a) an electrical system of a motor vehicle and (b) a generator system of a motor vehicle.

18. The semiconductor device according to claim 1, wherein the semiconductor device has a breakdown voltage between 10 V and 30 V.

19. The semiconductor device according to claim 18, wherein the semiconductor device has a breakdown voltage between 12 V and 30 V.

20. The semiconductor device according to claim 19, wherein the semiconductor device has a breakdown voltage between 15 V and 25 V.

21. The semiconductor device according to claim 1, wherein the PN diode is configured to perform a blocking operation at a high current density on the order of 400 A/cm$^2$ to approximately 600 A/cm$^2$.

22. The semiconductor device according to claim 1, wherein the p region is made of p-doped Si or poly-Si, wherein the contact layers are made of metal, wherein the contact layers are arranged in multiple layers, wherein the contact layer forms an ohmic contact with the p region, a Schottky contact with the n-layer and functions as a gate electrode for a MOS structure, wherein the trenches have one of a U-shaped cross-section and a rectangular cross-section, wherein the trenches are filled with p-doped Si or poly-Si over at most a portion of their depth wherein the device is configured so that a breakdown of the PN diode occurs in a region of the bottom of the trenches.

23. The semiconductor device according to claim 22, wherein the walls of the trenches are covered completely but the bottoms of the trenches are at most partially covered with an oxide layer, and p regions are disposed beneath the trenches in the n-layer.

24. The semiconductor device according to claim 23, wherein the diode is configured to perform a blocking operation at a high current density of about 400 A/cm$^2$ to approximately 600 A/cm$^2$, wherein the trenches are arranged as one of strips and islands, wherein the semiconductor device is configured as a Zener diode, and wherein the semiconductor device has a breakdown voltage between 10 V and 30 V.

25. The semiconductor device according to claim 24, wherein the semiconductor device has a breakdown voltage between 15 V and 25 V.

26. The semiconductor device according to claim 22, wherein the diode is configured to perform a blocking operation at a high current density of about 400 A/cm$^2$ to approximately 600 A/cm$^2$, wherein the trenches are arranged as one of strips and islands, wherein the semiconductor device is configured as a Zener diode, and wherein the semiconductor device has a breakdown voltage between 10 V and 30 V.

27. The semiconductor device according to claim 26, wherein the semiconductor device has a breakdown voltage between 12 V and 30 V.

\* \* \* \* \*